(12) United States Patent
Beuhler et al.

(10) Patent No.: US 6,342,164 B1
(45) Date of Patent: Jan. 29, 2002

(54) PINHOLE-FREE DIELECTRIC FILMS

(75) Inventors: Allyson Beuhler, Downers Grove; Gregory J. Dunn, Arlington Heights, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/628,485

(22) Filed: Jul. 31, 2000

(51) Int. Cl.⁷ .......................... H01L 27/14; G03C 5/00; H01G 9/00
(52) U.S. Cl. .................. 216/39; 216/6; 216/41; 216/106; 438/381; 438/754; 438/942; 29/25.03; 430/314; 430/317; 430/318; 430/325
(58) Field of Search .................. 216/6, 11, 39, 216/41, 83, 100, 105, 106, 108; 438/381, 754, 942, 945; 29/25.03; 430/314, 317, 318, 325

(56) References Cited

U.S. PATENT DOCUMENTS

| | | | | |
|---|---|---|---|---|
| 4,826,777 A | * | 5/1989 | Ondris | 437/2 |
| 5,036,373 A | * | 7/1991 | Yamazaki | 357/17 |
| 5,139,970 A | * | 8/1992 | Yamazaki | 437/184 |
| 5,192,703 A | * | 3/1993 | Lee et al. | 437/192 |
| 5,746,927 A | * | 5/1998 | Hashimoto et al. | 216/18 |
| 5,780,341 A | * | 7/1998 | Ogura | 438/259 |
| 5,927,992 A | * | 7/1999 | Hodges et al. | 438/439 |
| 6,022,485 A | * | 2/2000 | Cheek | 216/75 |
| 6,074,946 A | * | 6/2000 | Ouellet et al. | 438/689 |

* cited by examiner

Primary Examiner—Randy Gulakowski
Assistant Examiner—Jiri Smetana
(74) Attorney, Agent, or Firm—Douglas D. Fekete; Daniel W. Juffernbruch

(57) ABSTRACT

A method for producing a pinhole-free dielectric film comprising applying a photopolymer to a first dielectric surface of a dielectric film having pinholes, exposing a second and opposing surface to an amount of radiation effective to polymerize the photopolymer exposed by the pinholes, and removing unpolymerized photopolymer.

6 Claims, 3 Drawing Sheets

PINHOLE-FREE DIELECTRIC FILMS

This invention was made with support from the United States Government under Agreement No. F33615-96-2-1838, awarded by DARPA. The United States Government has certain rights in this invention.

FIELD OF THE INVENTION

The present invention generally relates to dielectric films in which pinholes are filled by photopolymer plugs.

BACKGROUND OF THE INVENTION

It has been proposed that a capacitor can be formed by disposing a dielectric film on a metal foil, then depositing a metal layer on the remaining exposed dielectric surface. However, when the dielectric film has pinholes, metal in the pinholes create short circuits (hereinafter "shorts") between the metal foil and the metal layer. One source of pinholes may result from the desire to form very thin dielectric films on the relatively rough surface of a metal foil. Current dielectric films are so thin that metal peaks on the metal foil surface occasionally protrude through the dielectric film. Nevertheless, significant interest remains for forming capacitor films on metal foil because capacitor films having the metal/dielectric/metal sandwich structure can be laminated on or embedded in circuit boards. Moreover, forming the dielectric layer on a metal foil allows the ceramic to form at a higher temperature than would be possible if the dielectric layer were formed on an organic circuit board. Higher temperature provides a dielectric thin film crystal structure with a higher capacitance than that provided by lower temperatures. It would be desirable to form pinhole-free dielectric films.

DETAILED DESCRIPTION OF THE DRAWINGS

Figure 10:
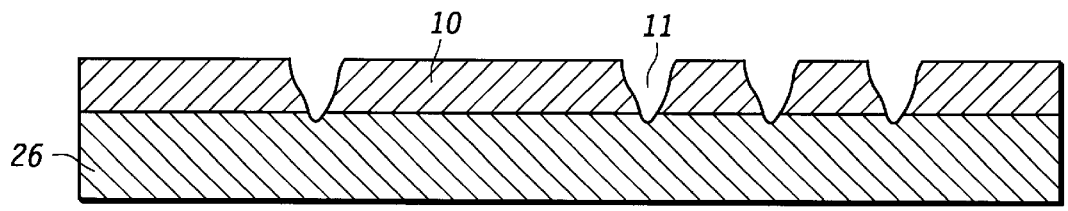
FIG. 10 illustrates a sectional view of multi-layer structure comprising an opaque dielectric film with pinholes on a transparent substrate.
Figure 11:
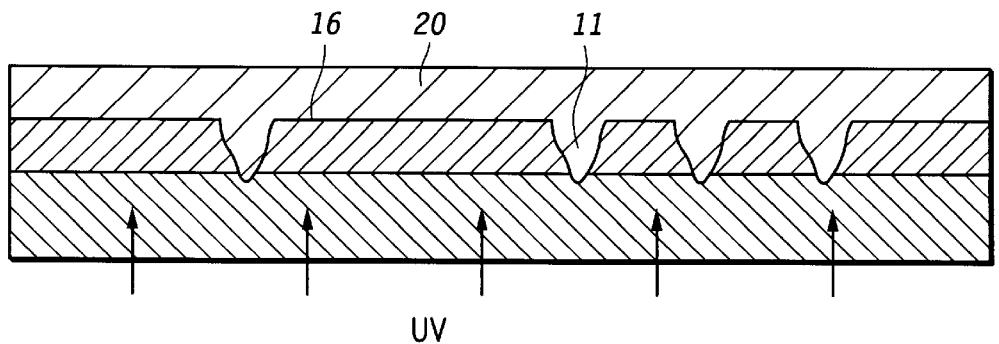
Figure 12:
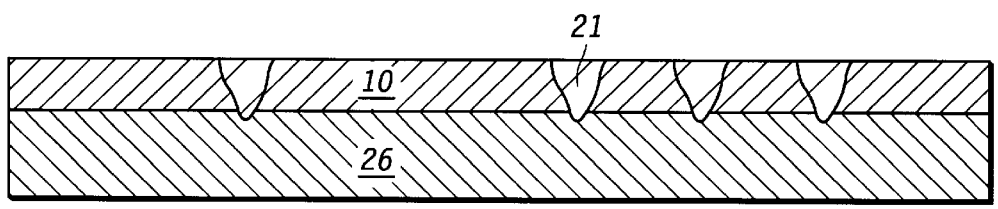

FIG. 11 illustrates the sectional view of the multi-layer structure of FIG. 10 where a photopolymer is applied over the opaque dielectric film to fill the pinholes and the multi-layer structure is irradiated through the transparent substrate to activate the photopolymer exposed by the pinholes; and FIG. 12 illustrates a sectional view of the multi-layer structure of FIG. 11 after unexposed photopolymer has been removed and the pinholes contain photopolymer plugs.

DETAILED DESCRIPTION OF THE PRESENTLY PREFERRED EMBODIMENTS

Figure 1:
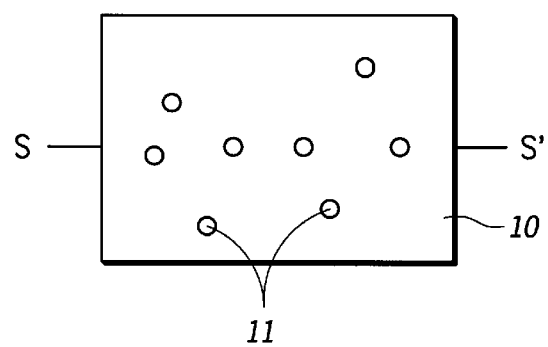
FIG. 1 illustrates a top view of a dielectric film having pinholes.
Figure 2:
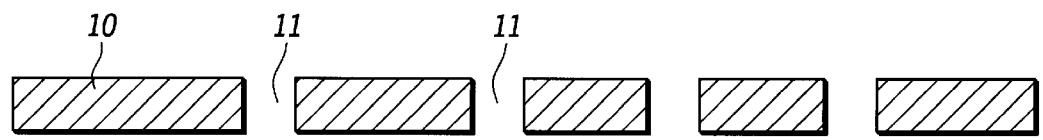
FIG. 2 illustrates a sectional view of the dielectric film of FIG. 1 along line S–S'.
Figure 3:
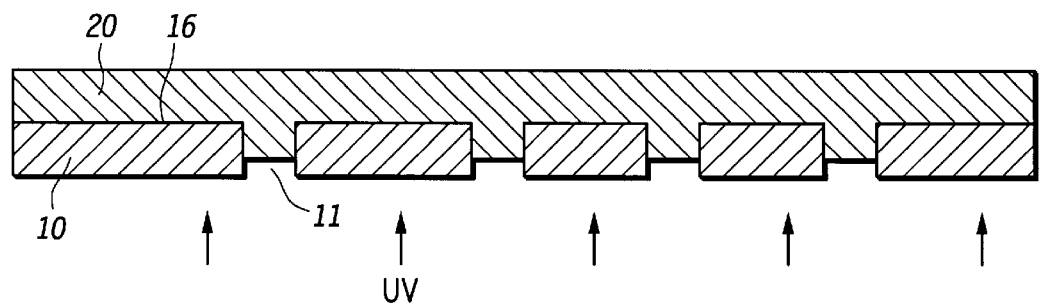
FIG. 3 illustrates the sectional view of the dielectric foil of FIG. 2 having a photopolymer disposed on one dielectric surface and in pinholes being exposed to radiation from a direction opposite of the dielectric surface that is in contact with the photopolymer.
Figure 4:
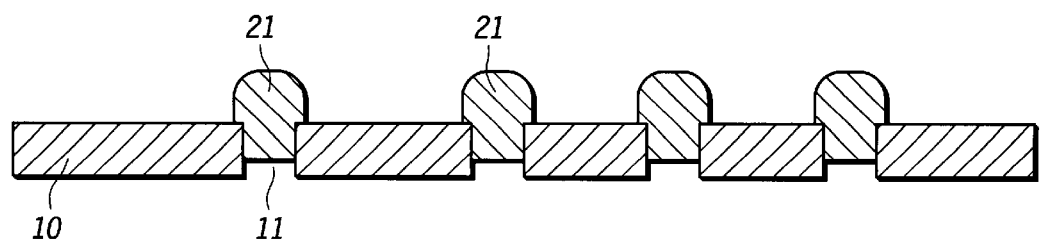
FIG. 4 illustrates a sectional view of an embodiment of the invention wherein unexposed photopolymer has been washed from the dielectric film and the pinholes contain photopolymer plugs.

The present invention is directed to a method of filling pinholes in dielectric films to prevent the formation of shorts during the manufacture of capacitors. As shown in FIG. 1, a sheet of dielectric film 10 can contain numerous pinholes 11. A cross sectional view of dielectric film 10 and pinholes 11 is found at FIG. 2. In FIG. 3, a photopolymer 20 has been applied to a dielectric surface 16 of the dielectric film 10 of FIG. 2, wherein pinholes 11 also contain the photopolymer. When the dielectric film is exposed to an amount of an actinic radiation from a direction opposite of dielectric surface 16, polymerization initiation (hereinafter "activation") only occurs for the photopolymer exposed by pinholes 11. In this case, the dielectric film is opaque to the radiation and acts as a mask against activating the portion of the photopolymer that is masked behind dielectric film 10. As shown in FIG. 4, after the dielectric film of FIG. 3 is washed with a solvent that selectively dissolves photopolymer that has not been activated, and leaves activated photopolymer, one obtains a dielectric film 10, wherein pinholes 11 contain photopolymer plugs 21 to obtain a pinhole-free dielectric film that has two dielectric surfaces on which conductors can be deposited.

Dielectric films according to this invention include perovskite structures formed from compositions comprising lead zirconate titanate (PZT), lead lanthanide zirconate titanate (PLZT), lead lanthanide titanate (PLT), lead titanate (PT), lead zirconate (PZ), lead magnesium niobate, barium titanate (BTO), barium strontium titanate (BSTO), strontium titanate or zirconium titanate formed by the chemical solution deposition (CSD) process. Specific embodiments include compositions that comprise lead, such as PZT, PLZT, PLT, PT or lead magnesium niobate.

As used herein, a pinhole may comprise any discontinuity within a dielectric film where two conductors on opposing sides of the dielectric film can form a short. Further, a pinhole is filled when it contains a sufficient amount of a material effective to prevent formation of a short between the two conductors on opposing surfaces of the dielectric thin film. Accordingly, the term pinhole-free is used when sufficient pinholes in a foil or film are plugged such that any formation of shorts is considered negligible.

Photopolymers as used herein must be non-conductive and have different solubilities between the unactivated and activated state in at least one solvent. As used herein, a photopolymer is activated at anytime after initiation of polymerization. Examples of photopolymers include dielectric, photoimageable, thick film polymers that can be patterned by known photoimaging and development techniques. Such photopolymers may comprise resin, photosensitive agents and hardeners. The resins may include any suitable liquid or solid resin that is readily deposited on a surface in liquid form or as a laminate. Examples of resins include thermoplastic resins, thermosetting resins, elastomers and mixtures thereof, which, when incorporated with a photosensitive material, yield a photoimageable composition. Desirably, the thick-film polymer remains stable during deposition and photoimaging, and in the operating environment of the capacitor and circuit board. Epoxies, such as PROBELEC 7081® from Ciba-Geigy and VIALUX 81, a dry film material from E.I. du Pont de Nemours & Company, are particularly suitable. Such polymer materials are applied in relatively thick layers (greater than ten microns), and have low permittivities. Therefore, if they were applied across the entire metal surface, they would yield a low capacitance density. An important advantage of the present invention is that the polymer is introduced only in the pinholes in the high capacitance thin film. The result is an average high capacitance density. For example, if pinholes accounted for 0.1% of the surface area of the thin film (a poor quality film), the capacitance density would still be 99.9% of that of a perfect thin film.

Figure 5:
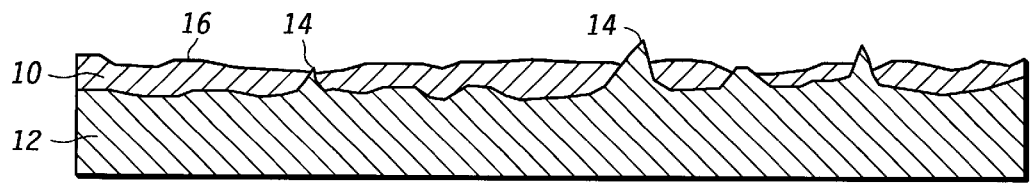
FIG. 5 illustrates a sectional view of a composite foil comprising a metal foil having a thin layer of dielectric disposed on one surface.
Figure 6:
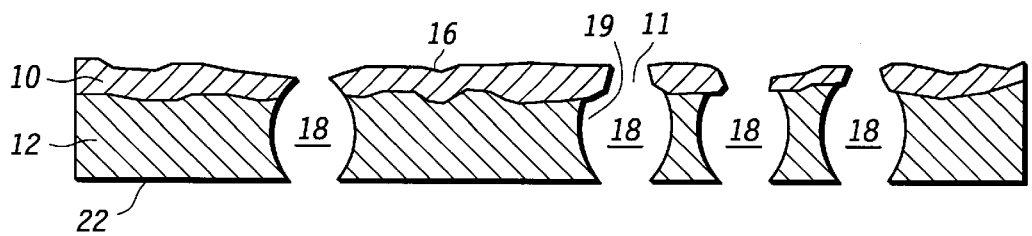
FIG. 6 illustrates the sectional view of the composite foil of FIG. 5, where metal that was exposed through the dielectric is etched away to form openings.

As shown in FIG. 5, pinholes can occur in composite films comprising metal foil 12 (e.g., sheet of 50 micron Cu foil coated with 4 micron electroless Ni—P from a $NiCl_2$—Na ($H_2PO_2$) solution bath) and dielectric film 10 (formed from e.g., methanol-based lead acetate trihydrate, titanium isopropoxide, lanthanum isopropoxide and zirconium N-butoxide applied to the foil by spun-on deposition; dried at 250° C. for 5 minutes; pyrolyzed in air at 450° C. for 10 minutes; the procedure being repeated 6 times to achieve about 6000 angstroms; then crystallized in nitrogen at 600° C. for 30 minutes). Here, dielectric film 10 is so thin that metal peaks 14 protrude from the underlying metal foil 12. If a layer of conductor is disposed on the exposed dielectric surface 16, the metal peaks 14 create shorts between the metal foil and the conductor at the pinholes. FIG. 6 illustrates the formation of channels 18 in the composite foil by exposing dielectric surface 16 to an etching solution, such as acid, until metal that is exposed through the dielectric surface 16 by the pinholes 11 is removed through to the opposing surface 22 of metal foil 12. In FIG. 6, most of metal foil 12 is not removed, because dielectric film 10 protects metal foil 12 from etching solution except at the pinholes. As used herein, a channel 18 comprises a pinhole 11 in the dielectric film and a gap 19 in the metal foil.

Figure 7:
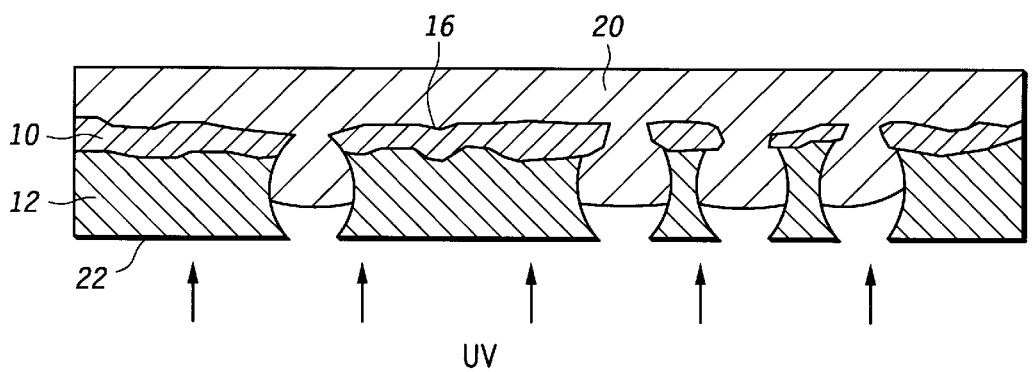
FIG. 7 illustrates a sectional view of the composite foil of FIG. 6 having a photopolymer disposed on the dielectric surface and in openings being exposed to radiation in a direction opposite of the dielectric surface such that only the photopolymer exposed by the openings is activated.

In FIG. 7, photopolymer 20 (e.g., PROBELEC 7081®) is applied over dielectric surface 16 such that channels 18 contain photopolymer. The composite foil is then exposed to actinic radiation (e.g., UV) on surface 22 in a direction opposing dielectric surface 16. In this manner, only the portion of the photopolymer exposed by the channels 18 is exposed to radiation, because one or both of the metal foil 12 and the dielectric film 10 is opaque to the radiation and acts as a mask. Optionally, the photopolymer is precured after activation by a heat bump.

Figure 8:
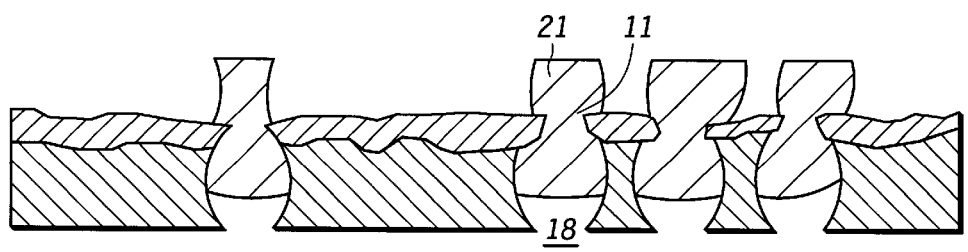
FIG. 8 illustrates a sectional view of an embodiment the invention, wherein unexposed photopolymer has been removed from the composite foil of FIG. 7 and the openings contain photopolymer plugs.
Figure 9:
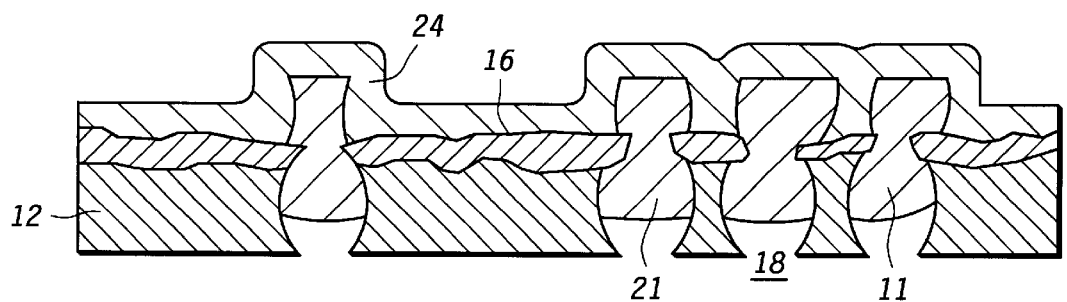
FIG. 9 illustrates a sectional view of an embodiment of the invention, wherein a conductor layer is deposited on the composite foil of FIG. 8 to form a pinhole-free capacitor foil.

The composite foil is then washed with a solvent that selectively dissolves unactivated photopolymer, while leaving activated photopolymer as plugs 21 in channels 18 (see FIG. 8). Optionally, the remaining photopolymer is cured. Accordingly, FIG. 8 illustrates a pinhole-free composite foil wherein pinholes 11 are filled by polymerized photopolymer plugs 21. FIG. 9 illustrates disposing a conductor layer 24 (e.g., by vacuum deposition of Cu, Pt or Ni) on dielectric surface 16 without forming a short with metal foil 12 because plugs 21 prevent conductor layer 24 from coming into contact with metal foil 12 through pinholes 11.

The metal foil comprises a metal layer, which may include, for example, copper, copper alloy, nickel, nickel alloy, platinum, or palladium. The metal foil may further comprise a barrier layer deposited on the metal layer by sputtering, electroless plating or electrolytic plating metals selected from palladium, platinum, iridium, nickel-phosphorus, nickel-chromium, or nickel-chromium with a minor amount of aluminum. More specific examples of barrier metals include electroless or electrolytic nickel-phosphorus. The phosphorous content of the nickel-phosphorous generally ranges from about 1 to about 40 wt % phosphorous, more specifically about 4–11 wt % and even more specifically about 7–9 wt %. As an example, a Cu/NiP foil such as that sold under the name Ohmega-Ply by Ohmega Technologies can be used as the metal foil according to the invention.

The conductor layer is selected from conductors, such as, for example, nickel, nickel alloy, copper, copper alloy, platinum or palladium. The conductor layer is deposited on the dielectric oxide layer by evaporation, sputtering, plasma chemical vapor deposition, or vacuum plating.

FIGS. 10–12 illustrate a multi-layer structure in which dielectric film 10 with pinholes 11 is disposed on a transparent substrate 26. In FIG. 11, photopolymer 20 is disposed on dielectric surface 16 so that the pinholes 11 contain photopolymer and the photopolymer is irradiated by actinic radiation through transparent substrate 26. In this case, the dielectric is opaque to act as a mask, and only photopolymer exposed by pinholes 11 is activated. After irradiation, the multi-layer structure is exposed to the solvent that dissolves only unactivated photopolymer 20 to remove the unactivated polymer. The activated photopolymer in the pinholes 11 becomes plugs 21 (see FIG. 8).

While the present invention has been described in terms of particular embodiments, it is apparent that one skilled in the art can adopt other forms without departing from the scope and spirit of this invention. Accordingly, the scope of the invention is limited only by the literal and equivalent scope of the claims that follow. In addition, any art cited herein is incorporated by reference.

We claim:

1. A method for forming a pinhole-free dielectric film comprising:

applying a photopolymer comprising an epoxy to a first dielectric surface of a dielectric film including a plurality of pinholes in the dielectric surface, such that the pinholes contain photopolymer;

from a direction of a second dielectric surface which is opposite the first dielectric surface, irradiating the dielectric film with an amount of actinic radiation effective to activate the photopolymer, wherein only the portion of the photopolymer exposed by the pinholes is activated because the dielectric film is opaque and masks the portion of the photopolymer that is not exposed by the pinholes;

removing unactivated photopolymer by washing the dielectric film with a solvent that selectively removes unactivated photopolymer, but does not remove activated photopolymer.

2. A method for forming a pinhole-free dielectric film comprising:

applying a photopolymer comprising an epoxy to a first dielectric surface of a dielectric film including a plurality of pinholes in the dielectric surface, such that the pinholes contain photopolymer;

from a direction of a second dielectric surface which is opposite the first dielectric surface, irradiating the dielectric film with an amount of actinic radiation effective to activate the photopolymer, wherein only the portion of the photopolymer exposed by the pinholes is activated because the dielectric film is opaque and masks the portion of the photopolymer that is not exposed by the pinholes;

removing unactivated photopolymer by washing the dielectric film with a solvent that selectively removes unactivated photopolymer, but does not remove activated photopolymer; and wherein the dielectric film is formed from dielectric oxides selected from the group consisting of lead zirconate titanate, lead lanthanide zirconate titanate, lead lanthanide titanate, lead titanate, lead zirconate, lead magnesium niobate, barium titanate, barium strontium titanate, strontium titanate and zirconium titanate.

3. A method for forming a pinhole-free dielectric film comprising:

applying a photopolymer comprising an epoxy to a first dielectric surface of a dielectric film including a plurality of pinholes in the dielectric surface, such that the pinholes contain photopolymer;

from a direction of a second dielectric surface which is opposite the first dielectric surface, irradiating the dielectric film with an amount of actinic radiation effective to activate the photopolymer, wherein only the portion of the photopolymer exposed by the pinholes is activated because the dielectric film is opaque and masks the portion of the photopolymer that is not exposed by the pinholes;

removing unactivated photopolymer by washing the dielectric film with a solvent that selectively removes unactivated photopolymer, but does not remove activated photopolymer; and wherein a metal foil is disposed on the second dielectric surface, wherein the metal foil is made from a metal layer selected from the group consisting of copper, copper alloy, nickel, nickel alloy, platinum, and palladium, and wherein the metal foil further comprises a nickel-phosphorous barrier interposed between the metal layer and the dielectric film.

4. A method for forming a pinhole-free composite film comprising:

on a composite foil comprising a metal foil and a dielectric film, the composite foil having a metal surface, a dielectric surface opposing the metal surface and a pinhole in the dielectric film through which a metal peak protrudes from the dielectric surface, exposing the dielectric surface to a sufficient amount of acid to remove sufficient metal that is exposed through the pinhole until a channel is formed between the metal surface and the dielectric surface;

applying a photopolymer to the dielectric surface such that the channel contains photopolymer;

irradiating the metal surface with an amount of actinic radiation suitable to activate a portion of photopolymer that is exposed by the pinhole, while a portion of photopolymer that is masked by metal foil is unactivated; and removing unactivated photopolymer by washing the dielectric film with a solvent that selectively removes unactivated photopolymer, but does not remove activated photopolymer.

5. The method of claim 4, further comprising depositing a conductor layer on the dielectric surface.

6. The method of claim 5, wherein:

the photopolymer comprises an epoxy;

the dielectric film is formed from dielectric oxides selected from the group consisting of lead zirconate titanate, lead lanthanide zirconate titanate, lead lanthanide titanate, lead titanate, lead zirconate, lead magnesium niobate, barium titanate, barium strontium titanate, strontium titanate and zirconium titanate;

the metal foil is copper with a nickel-phosphorous outer layer; and the conductor layer is selected from the group consisting of copper, nickel, palladium and platinum.

* * * * *